(12) United States Patent
Blakers et al.

(10) Patent No.: US 7,169,669 B2
(45) Date of Patent: Jan. 30, 2007

(54) METHOD OF MAKING THIN SILICON SHEETS FOR SOLAR CELLS

(75) Inventors: Andrew William Blakers, Australian Capital Territory (AU); Klaus Johannes Weber, Australian Capital Territory (AU)

(73) Assignee: Origin Energy Solar Pty. Ltd., Adelaide (AU)

( * ) Notice: Subject to any disclaimer, the term of this patent is extended or adjusted under 35 U.S.C. 154(b) by 66 days.

(21) Appl. No.: 10/497,369

(22) PCT Filed: Dec. 4, 2002

(86) PCT No.: PCT/AU02/01640

§ 371 (c)(1),
(2), (4) Date: Nov. 18, 2004

(87) PCT Pub. No.: WO03/049201

PCT Pub. Date: Jun. 12, 2003

(65) Prior Publication Data

US 2005/0070059 A1    Mar. 31, 2005

(30) Foreign Application Priority Data

Dec. 4, 2001  (AU) .................................... PR9307

(51) Int. Cl.
*H01L 21/336* (2006.01)

(52) U.S. Cl. ........................ 438/258; 438/696; 438/705

(58) Field of Classification Search ................ 438/258, 438/696, 704, 705, 706
See application file for complete search history.

(56) References Cited

U.S. PATENT DOCUMENTS

| | | | |
|---|---|---|---|
| 4,982,099 A | 1/1991 | Lischke | 250/492.2 |
| 5,306,647 A | 4/1994 | Lehmann et al. | 437/2 |
| 6,689,694 B1 * | 2/2004 | Cho et al. | 438/696 |
| 2001/0013630 A1 | 8/2001 | Cho et al. | 257/419 |

FOREIGN PATENT DOCUMENTS

| | | |
|---|---|---|
| DE | 3 803 769 | 8/1989 |
| DE | 19 650 111 A1 | 6/1998 |
| WO | WO 98/32164 | 7/1998 |

* cited by examiner

*Primary Examiner*—Phuc T. Dang
(74) *Attorney, Agent, or Firm*—Woodcock Washburn LLP (57) ABSTRACT

A thin layer of single-crystal silicon is produced by forming first trenches in a silicon substrate having (111) orientation; forming narrower second trenches at the bases of the trenches; anisotropically etching lateral channels (4) from the second trenches, until adjacent etch fronts (16) substantially meet; and detaching said layer from the substrate. The trenches may be arranged so that the resultant layer has rows of slots, whit the slots in adjacent rows being mutually offset. Solar cells may be formed on strips (5) between the trenches, having lengths of more than 50 mm, widths of up to 5 mm, and thicknesses of less than 100 microns, and having two electrical contacts on the same face (6) of each strip (5).

9 Claims, 15 Drawing Sheets

METHOD OF MAKING THIN SILICON SHEETS FOR SOLAR CELLS

This application is a 371 of PCT/AU02/01640 filed Dec. 4, 2002.

FIELD OF THE INVENTION

This invention relates to processes for producing thin crystalline layers of silicon, to the fabrication of solar cells from these layers, and to solar cells fabricated from these layers.

BACKGROUND

In most areas of semiconductor processing, the cost of the starting substrate wafer is small compared to the value of the final, processed wafer. However, this is not always the case. For example, the photovoltaic solar cell industry is extremely cost sensitive, and the cost of a starting silicon wafer is typically nearly half of the value of the finished photovoltaic module. Thus, in this industry it is extremely important that the silicon substrates are used as efficiently as possible. These substrates are produced by sawing thin slices from a cylindrical boule of crystalline silicon. The thinnest slice that can be cut is determined by the mechanical properties of the silicon and the sawing technology, and is typically 300–400 μm for the current generation of wafers, but is projected to be 200 μm for the next wafer generation. However, the kerf loss in sawing the wafer is approximately 250 μm, meaning that most of the boule ends up as powder. It is desired, therefore, to provide a more efficient way of producing thin single crystal silicon layers.

SUMMARY OF THE INVENTION

In accordance with the present invention, there is provided a process for producing a layer of single-crystal silicon, said process comprising the steps of:
  forming parallel, first trenches in a surface of a silicon substrate of substantially (111) orientation;
  applying an etch-resistant layer to the surface of said first trenches;
  forming a series of narrower second trenches inside said first trenches;
  contacting said second trenches with an etchant to which {111} planes of silicon are substantially resistant, and etching lateral channels from said second trenches until adjacent and opposing etch fronts at least substantially meet, thereby defining said layer of single-crystal silicon; and
  detaching said layer from said substrate.

The layer of single-crystal silicon may comprise a plurality of strips of silicon, which optionally may be attached to the layer at one or both ends of the strips. The processes of the invention may further comprise the step of separating the strips from the layer of silicon. In a preferred form of the invention, the process further comprises the steps of forming a plurality of solar cells from the plurality of strips before or after the strips are separated.

The invention further provides a layer of single-crystal silicon produced by a process of the invention.

The invention still farther provides a solar cell produced by a process of the invention.

In a second embodiment, the invention provides a sheet of silicon having a thickness of up to about 100 microns, said sheet including a plurality of parallel rows of slots therethrough, each of said rows containing a plurality of said slots arranged endwise therein, wherein the slots in each row are offset with respect to the slots in an immediately adjacent row.

DETAILED DESCRIPTION OF THE INVENTION

In the present invention, by "surface of a silicon substrate of substantially (111) orientation" is meant that the silicon substrate is either of precisely (111) orientation, or otherwise sufficiently close to (111) orientation that when the lateral channels have been etched, adjacent channels either meet or approach each other sufficiently closely that the layer may be detached from the substrate by the application of force substantially without damaging the layer. Typically the surface of the silicon substrate is at an angle of from 0° to about 10° from the (111) orientation, more typically from 0° to about 7°, more typically from 0° to about 40°.

Preferably, adjacent and opposing etch fronts meet to provide for separation of the layer of silicon which will no longer be joined to the substrate when the etch fronts meet. Alternatively, the etching proceeds until adjacent and opposing etch fronts almost meet and the layer of silicon is then mechanically detached by breaking of the remaining connection(s) between the layers and the substrate. Thus, by "substantially meet" is meant that the adjacent and opposing etch fronts approach each other sufficiently closely that the layer of silicon present above the lateral channels remains attached to the substrate but is readily removable from it.

In one form of the invention, the first and second trenches extend continuously from one edge of the silicon substrate to an opposite edge to produce a plurality of thin strips of silicon after the steps of etching the lateral channels and detachment of the layer. In another form of the invention, the first and second trenches do not extend as far as at least one edge, more typically both edges, of the silicon substrate so that a series of strips is formed by the etching step, but the strips remain attached either at one end or at both ends to part of the layer of silicon. The strips may be separated from the layer of silicon after they have been subjected to any further processing steps that may be desired, by cutting their end or ends from the remainder of the layer. In still another form of the invention, the trenches are arranged in parallel rows, each row of trenches containing a plurality of trenches arranged endwise in them and the trenches in each row being staggered or offset with respect to the trenches in an immediately adjacent row. None of the trenches extends the whole way across a surface of the silicon substrate, so that a single crystal silicon sheet is formed after etching and detachment. The single sheet exhibits a pattern of slots identical to the pattern of trenches in the silicon substrate before the etching step. The rows of trenches are spaced from each other by a distance of less than 0.3 times the length of each trench. Each trench is typically et least about 0.5 mm long, more typically in the range of from 2 to 10 mm.

The first trenches can, for example, be formed using a laser, a dicing saw or by an etching process such as plasma etching or wet etching in combination with a suitably patterned etch mask. The narrower trenches can for example be formed using a laser, a dicing saw or by an etching process such as plasma etching or wet etching in combination with a suitably patterned etch mask.

The first trenches are typically from about 1 micron to about 100 microns deep, more typically from about 20 microns to about 70 microns deep, and typically range in width from about 50 microns to about 200 microns. Thus, the layer of single crystal silicon is typically from about 1 micron to about 100 microns in thickness.

The first trenches are most usually about 0.1 mm wide. They may be spaced from about 0.1 mm to several millimetres apart. Typically, the spacing of the first trenches is from about 0.5 mm to about 5 mm, more typically from about 0.5 mm to about 2 mm.

The narrower trenches range in depth from less than one micron to tens of microns, more typically from about 1 micron to about 5 microns. Usually, the narrower trenches occupy from about 25% to about 90% of the width of the first trenches.

The etch-resistant layer formed on the first trenches is a layer of a material that is etched at a much slower rate by the etchant used to etch the lateral channels, compared to the rate of etching of the silicon. As a result, the etch-resistant layer is intact after the step of etching the lateral channels (although it may be thinned to some extent) so that the only places where the silicon is etched are in the second trenches, where there is no etch resistant layer on the silicon.

Suitable anisotropic etchants for silicon to which {111} planes are etch-resistant are well known to persons of ordinary skill in the art and include aqueous potassium hydroxide solution, for example of from about 20–50 wt %, more usually about 30 wt %, concentration. Other etchants that may be used include tetramethylammonium hydroxide solutions and sodium hydroxide solutions.

Suitable etch-resistant layer materials include silicon dioxide and silicon nitride.

It will be apparent that the present invention allows ordinary silicon wafers to be processed to produce thin rectangular strips of silicon or a silicon sheet, the thickness of the strips or the sheet being much smaller than the wafer thickness. The individual strips or sheet can be processed into solar cells and then detached from the substrate. Following this process, a layer of substrate is removed which is much thinner than can be achieved by prior art cutting processes, with much less waste than using prior art processes. Because the substrate has been reduced in thickness by an amount much less than the original substrate thickness, the remainder can be re-used for the production of further thin silicon strips or sheet. Thus, from a single silicon wafer it is possible to obtain at least two, and typically several, thin layers for use (for instance) in solar cells.

Solar cells are conveniently fabricated from strips of silicon while they are still attached to the layer of silicon obtained by a process of the invention. As a result, the solar cells have the same dimensions as the strips and have two electrical contacts on the same face of the strip.

Thus, in a third embodiment, the invention provides a solar cell having a width of up to about 5 mm, more typically up to about 2 mm, a thickness of up to about 0.1 mm, more typically up to about 70 microns, and having a pair of electrical contacts on one face of said solar cell. Typically, the solar cell of the third embodiment has a length of at least 20 mm, more typically more than about 50 mm.

Alternatively, a solar cell may be fabricated from a silicon sheet of the second embodiment.

BRIEF DESCRIPTION OF THE DRAWINGS

Preferred embodiments of the present invention are hereinafter described, by way of example only, with reference to the accompanying drawings, wherein.

DETAILED DESCRIPTION OF THE PREFERRED EMBODIMENT AND OTHER EMBODIMENTS

In the accompanying Figures, the same or similar features are identified throughout by the same reference numerals. The Figures are diagrammatic, and are not to scale.

FIGS. 1–4 illustrate schematically a broad form of the process of the invention, as follows.

Figure 1:
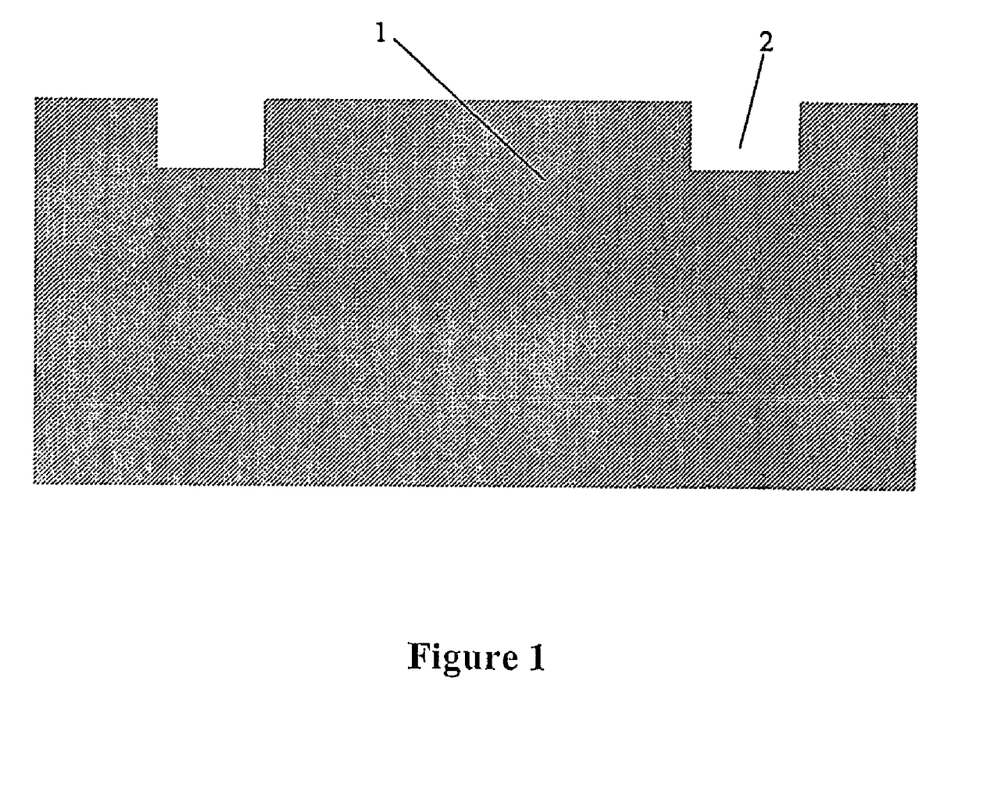
FIG. 1 is a schematic diagram showing a cross-sectional view of a silicon wafer following the formation of first trenches in accordance with a preferred embodiment.
Figure 2:
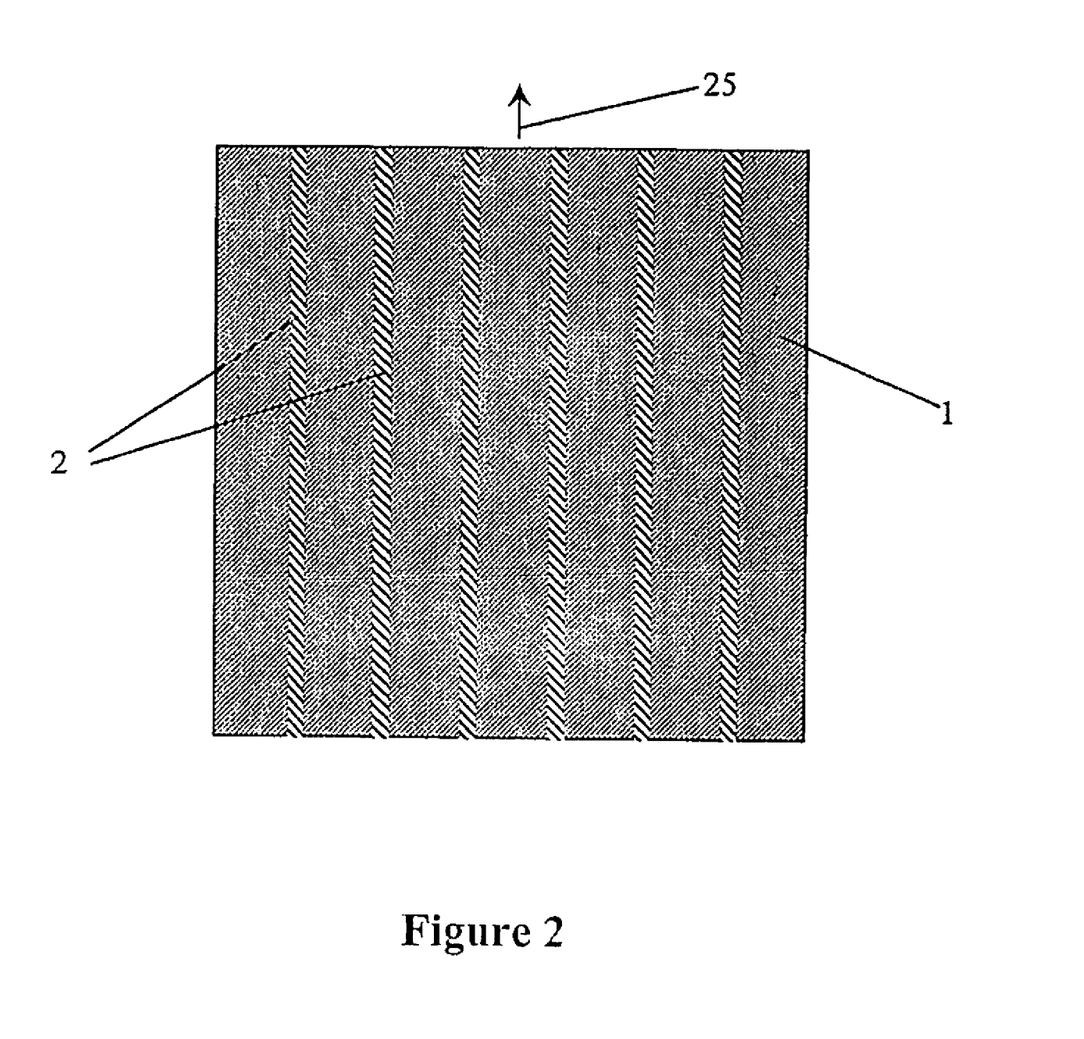
FIG. 2 is a schematic diagram showing a top view of a silicon wafer following the formation of first trenches in accordance with a preferred embodiment.

A series of regularly spaced, parallel trenches 2 are formed in the surface of a (111)-oriented, 1 mm thick silicon wafer 1, as shown in FIGS. 1 and 2. The trenches are oriented along the [−211] direction 25, and are from several microns to tens of microns deep, typically 0.1 mm wide and spaced from several hundred microns to several millimetres apart. The wide trenches are formed with a dicing saw, a laser, or by a chemical etching process, as is well known in the art. Other trench directions 25 could be used, provided that the trenches are not oriented along the [01-1], [10-1] or [1-10] directions.

Figure 3:
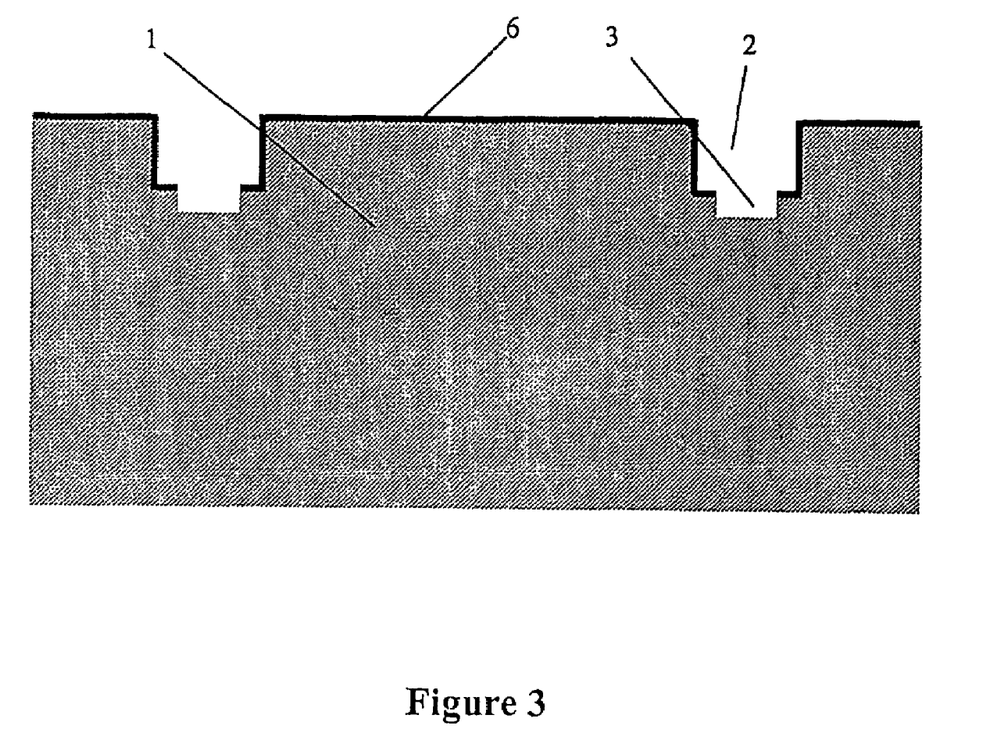
FIG. 3 is a schematic diagram showing a cross sectional view of a silicon wafer following the formation of first and second trenches in accordance with a preferred embodiment.

An etch mask layer 6 is deposited on the wafer 1 and trenches 2, as shown in FIG. 3. The etch mask is a suitable dielectric such as silicon dioxide or silicon nitride. Narrower trenches 3 are then formed at the bottom of the wider trenches 2, in such a way that the etch mask 6 covering the sidewalls of the wider trenches 2 remains intact. The depth of the narrower trenches 3 ranges from less than one micron to some tens of microns deep. The narrower trenches 3 may be formed by a variety of techniques such as sawing, laser ablation, or reactive ion etching (RIE). If RIE is used, the mask is lithographically patterned prior to etching. Otherwise, a single sawing or laser ablation process step is used to remove both the mask and the underlying silicon.

Figure 4:
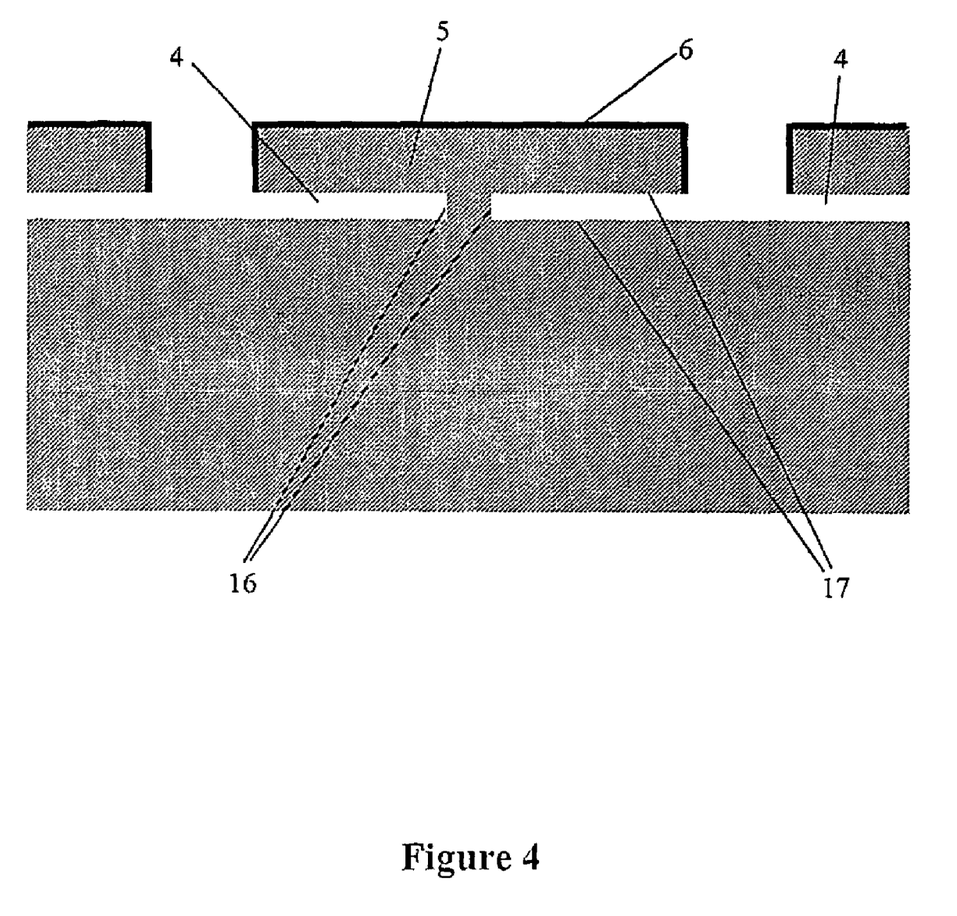
FIG. 4 is a schematic diagram showing a cross sectional view of a silicon wafer following etching in a wet anisotropic etchant in accordance with a preferred embodiment.
Figure 5A:
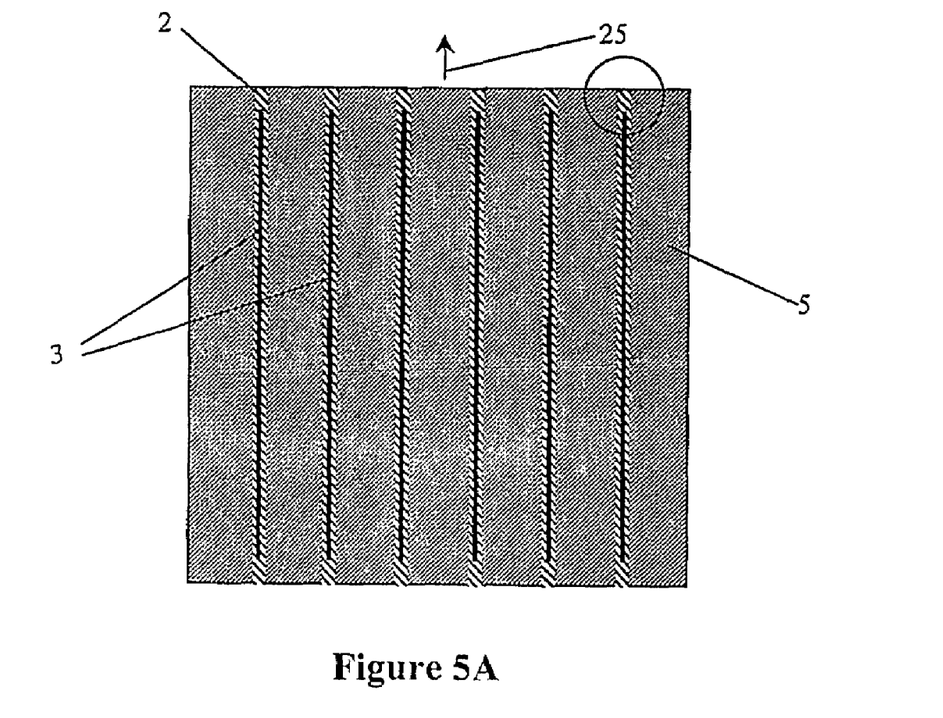
FIG. 5A is a schematic diagram showing a top view of a silicon wafer following the formation of first and second trenches and an enlarged top view of a region near the edge of the wafer in accordance with a preferred embodiment.
Figure 5B:
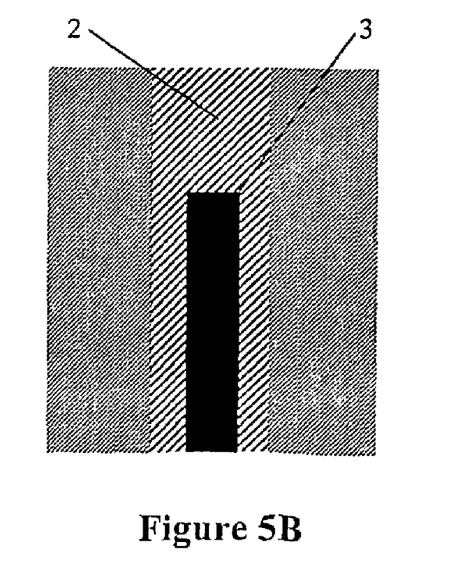
FIG. 5B is an enlarged diagram of the circled portion of FIG. 5A.

The wafer is then immersed in a suitable wet anisotropic etchant, such as a solution of 30 g of potassium hydroxide (KOH) per 100 ml of water. This etch has the property of etching the silicon {111} planes 17 at a much slower rate than other crystallographic planes in silicon. Lateral channels 4 are formed during the etching process which undercuts the original silicon surface outside the trenches 2, as shown in FIG. 4. As etching proceeds, the various lateral etch fronts 16 will eventually meet and produce a series of silicon strips which are released from the substrate. However, if it is desired to prevent these strips from detaching completely from the substrate, the narrower trenches 3 may not extend to the edge of the wafer, as shown in FIGS. 5A and 5B. This ensures that the silicon strips 5 remain attached to the substrate at the edges after the etch fronts have met and have detached silicon strips 5 from substrate 1 everywhere else.

Figure 6:
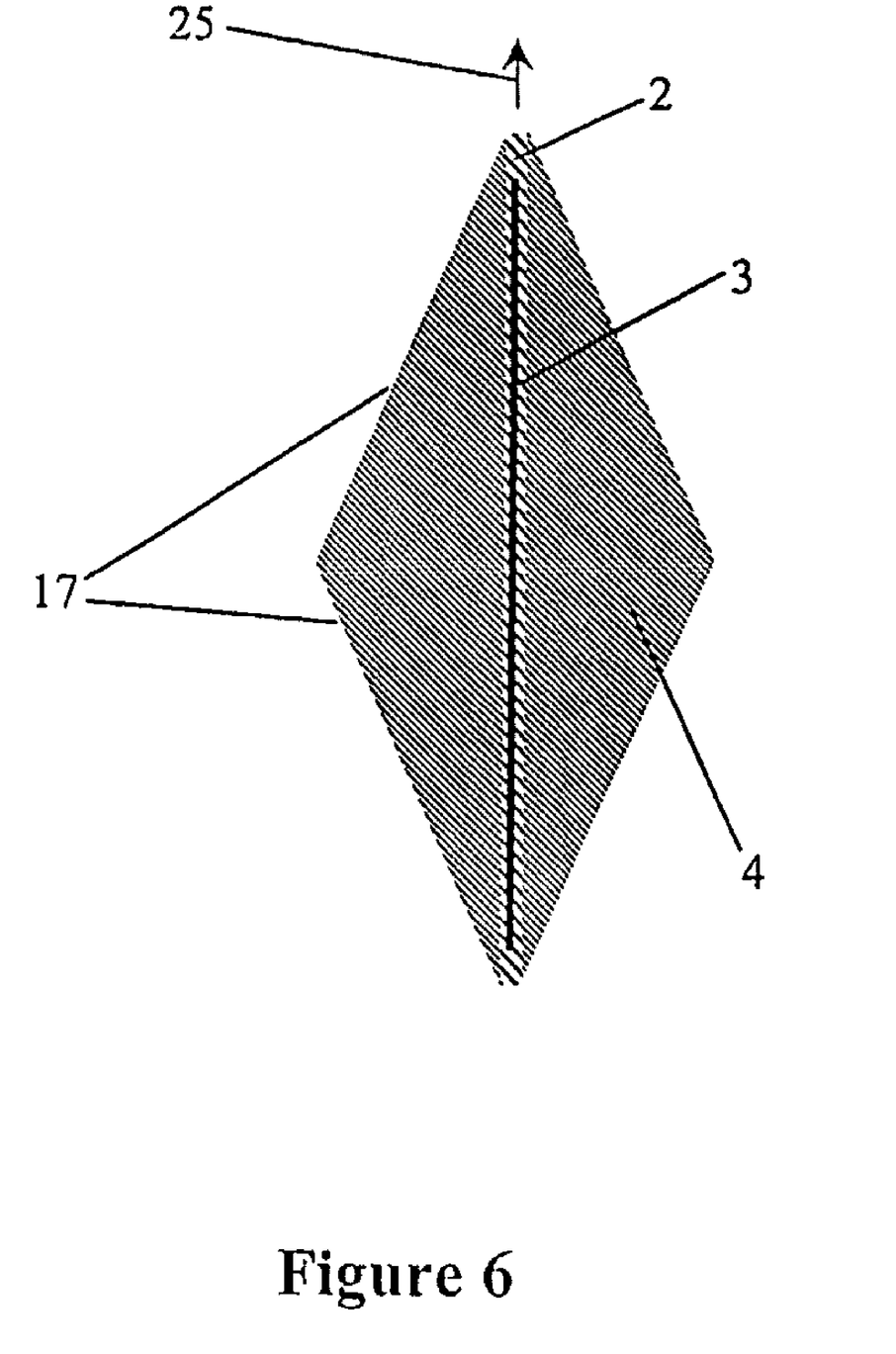
FIG. 6 is a schematic diagram showing a top view of a part of a wafer showing a narrow trench and the shape of the void etched out following immersion in anisotropic etchant in accordance with a preferred embodiment.
Figure 7:
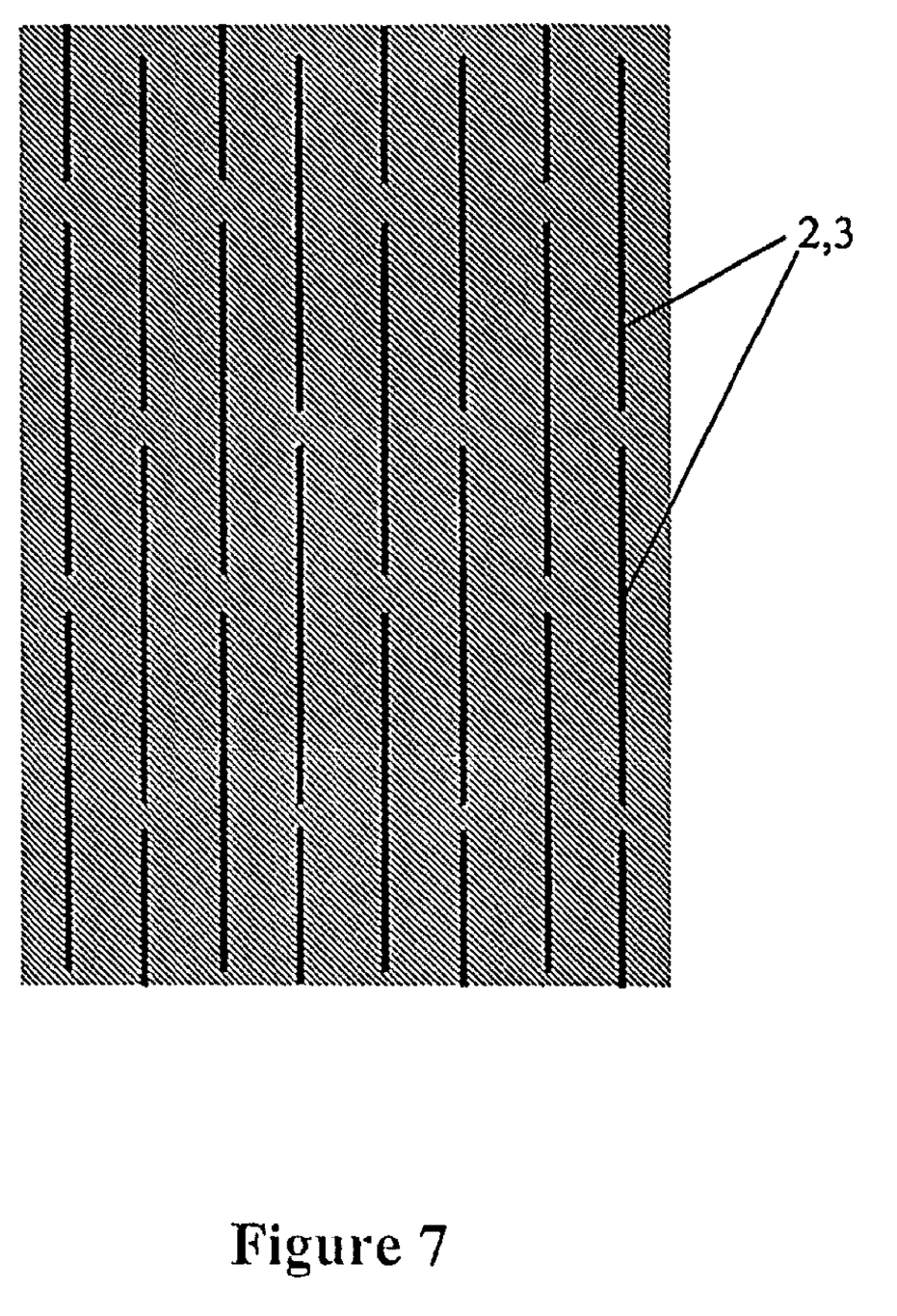
FIG. 7 is a schematic diagram showing a top view of a wafer containing an arrangement of trenches that results in a continuous sheet of thin silicon in accordance with a preferred embodiment.

Due to the different etch rates of the different crystal planes, the lateral channel produced by the anisotropic etch has a characteristic shape. For example, if a single wide trench 2 and narrow trench 3 were etched on a (111) silicon wafer as described above, the resulting channel 4, viewed from above or below, would have a diamond shape bounded by {111} planes 17, as shown in FIG. 6. If a series of trenches 2, 3 are cut into the surface of a wafer, they may be arranged, as shown in FIG. 7, in such a way that the entire top layer of the silicon wafer can be detached from the substrate in a single sheet, by virtue of the adjacent and opposed etch fronts eventually meeting, and extending to the edges of the substrate. An essential feature of the required pattern of trenches is that the lateral channels 4 extending from each narrow trench 3, as shown in FIG. 6, are offset with respect to lateral channels 4 extending from immediately adjacent trenches 3: FIG. 7 shows one suitable arrangement.

Figure 8:
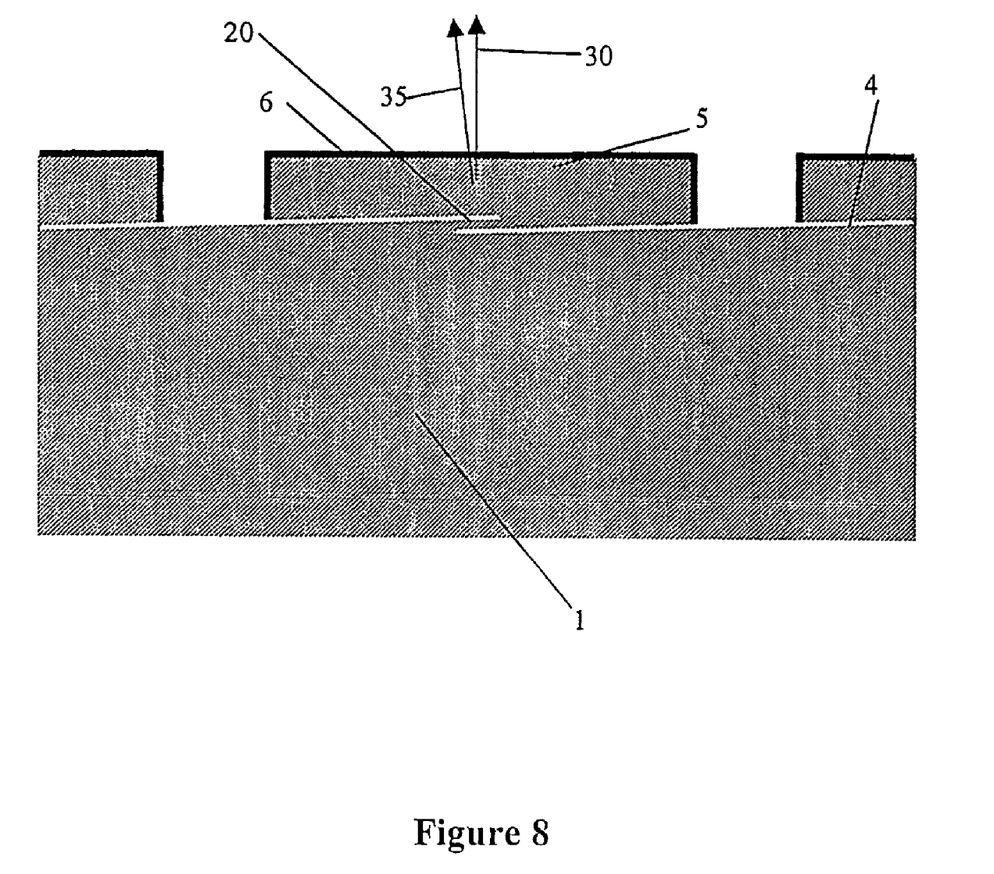
FIG. 8 is a schematic diagram showing a cross section of a wafer following anisotropic etching whose surface is deliberately misaligned from the (111) plane in accordance with a preferred embodiment.

In an alternative embodiment, a starting wafer is chosen which is cut slightly away from the (111) plane by an angle α of approximately 1–4°. This is shown in an exaggerated way in FIG. 8 by the angle between a normal 30 to the surface of silicon 1 and the [111] direction 35. A set of wider and narrower trenches is formed in the wafer and covered with an etch mask 6, as described above. However, the narrower trenches are very shallow: only a few microns in depth or less. The wafer is then etched with a suitable anisotropic etchant until the etch fronts start to overlap each other as shown. Due to the misorientation of the wafer, and the fact that the channels 4 formed by etching are quite narrow in the vertical direction, the etch fronts do not meet, but instead leave a thin strip 20 of silicon between them. This method may be used to keep the silicon strips or silicon sheet attached to the substrate following etching. The strips or sheet are eventually detached by bonding the strips or sheet to a suitable superstrate and applying a moderate force to the superstrate, in such a way as to effect detachment from the substrate. Other methods of detachment, such as ultrasonic agitation, may also be used.

Figure 9:
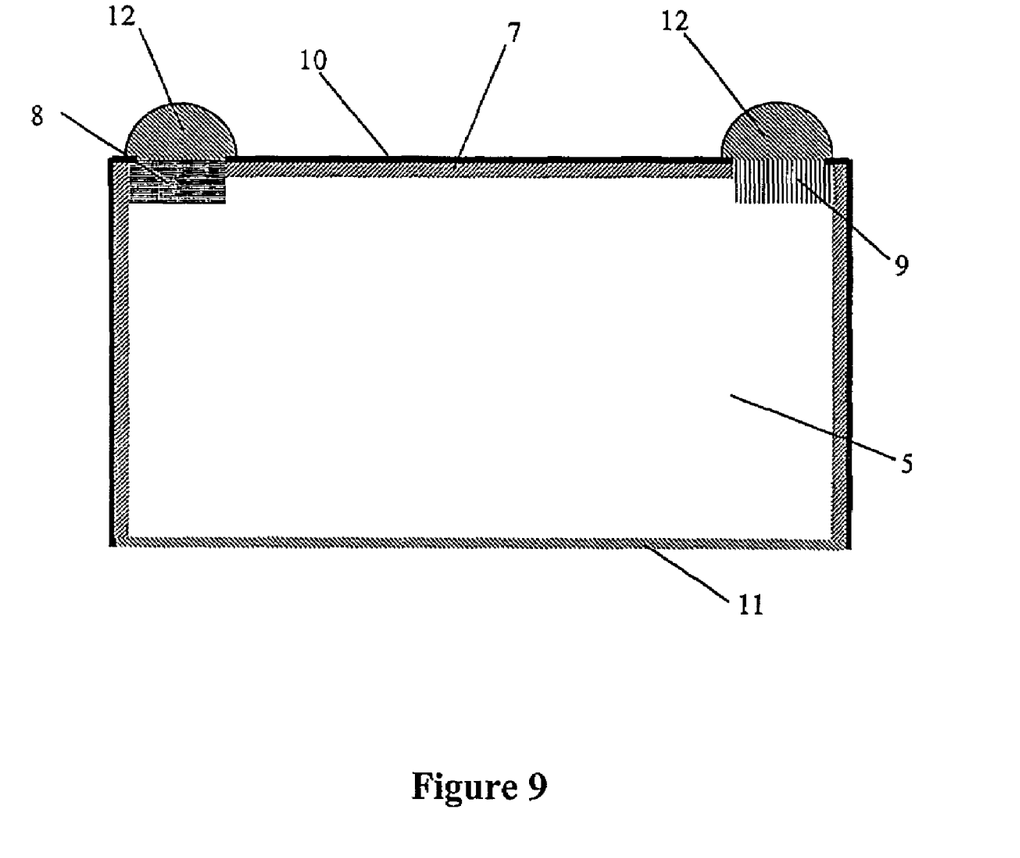
FIG. 9 is a schematic diagram showing a cross section of a solar cell made from a thin silicon strip produced in accordance with a preferred embodiment.

A solar cell may be formed from each silicon strip released from a p-type silicon substrate as shown in FIG. 9. This cell may be produced as follows.

First, regularly spaced wide trenches (not shown in FIG. 9) are formed in the substrate, for example using a dicing saw, as described above. A light phosphorus diffusion 7 of typically 200 ohms per square is made over the entire wafer surface. Next, a layer of silicon dioxide 10 typically 400 nm thick is grown. Shallow grooves are created in the top surface, preferably by laser ablation. A heavy (typically 20 ohms per square) phosphorus diffusion 8 is made into the grooves. A thin oxide is then grown on top of the grooves. A second set of grooves is created, again preferably by laser ablation. A boron diffusion 9 is made into this set of grooves (typically 80 ohms per square). An oxide typically 100 nm thick is subsequently grown, followed by the deposition of typically 50 nm of silicon nitride, preferably by low pressure chemical vapour deposition (LPCVD). Narrow trenches are then formed at the bottom of the wide trenches, as described above. The substrate is immersed in a suitable solution of KOH and etched until the silicon strips 5 are released from the substrate everywhere except at the wafer edges. Another phosphorus diffusion (not shown) of around 200 ohm per square can be carried out in order to provide a diffused rear surface on each silicon strip. Another oxide 11 is now grown, typically 200 mm thick. The silicon nitride is stripped using a suitable etch such as hot phosphoric acid, and the oxide covering the heavily diffused regions is removed in order to expose the contact regions for the p and n metal contacts. Next, the contacts are metallised to apply metal contacts 12, for example by electroless plating. The silicon strips can now be attached to a superstrate using a suitable adhesive. Finally, the strips are detached from the substrate by cutting through the strips near the edge of the substrate.

Figure 10A:
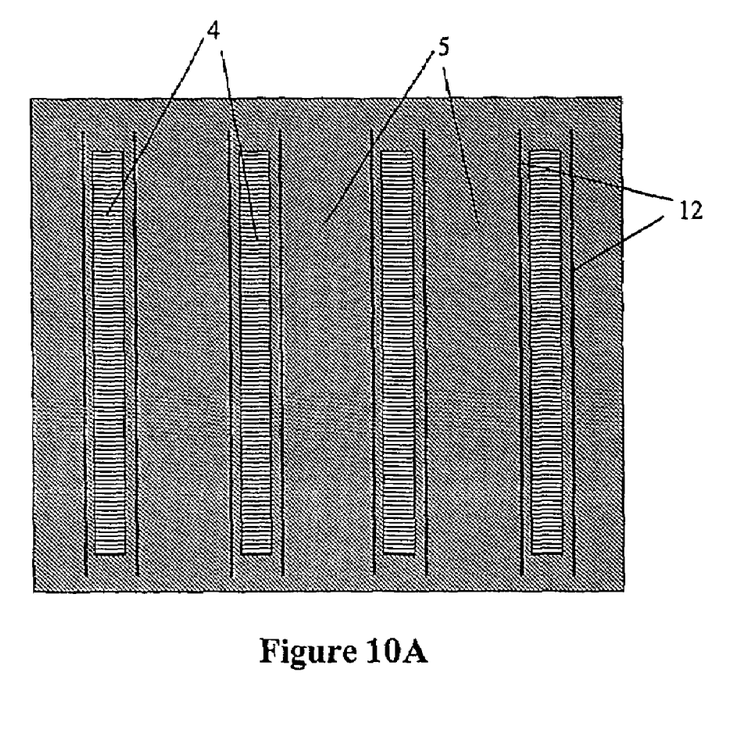
FIG. 10A is a schematic diagram showing a top view of a wafer with solar cells formed on strips just prior to cell interconnection.
Figure 10B:
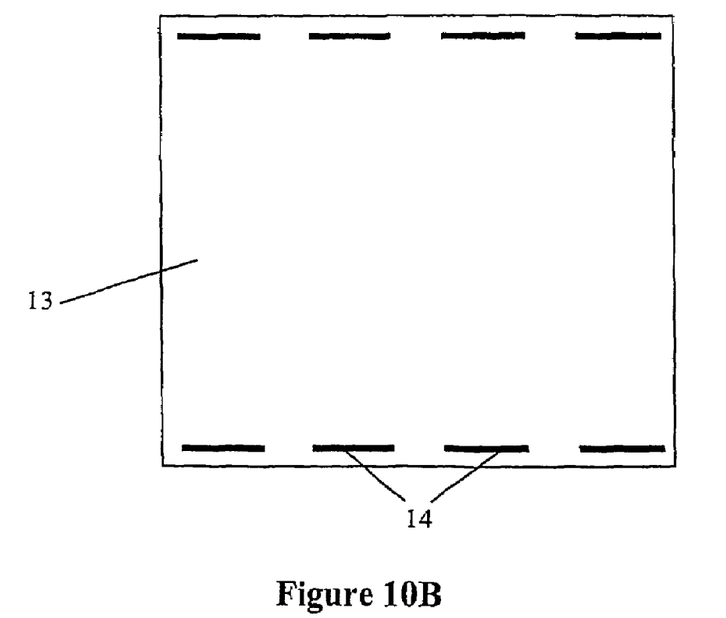
FIG. 10B is a diagram of a glass superstrate in accordance with a preferred embodiment, for use with the solar cells depicted in FIG. 10A.
Figure 11:
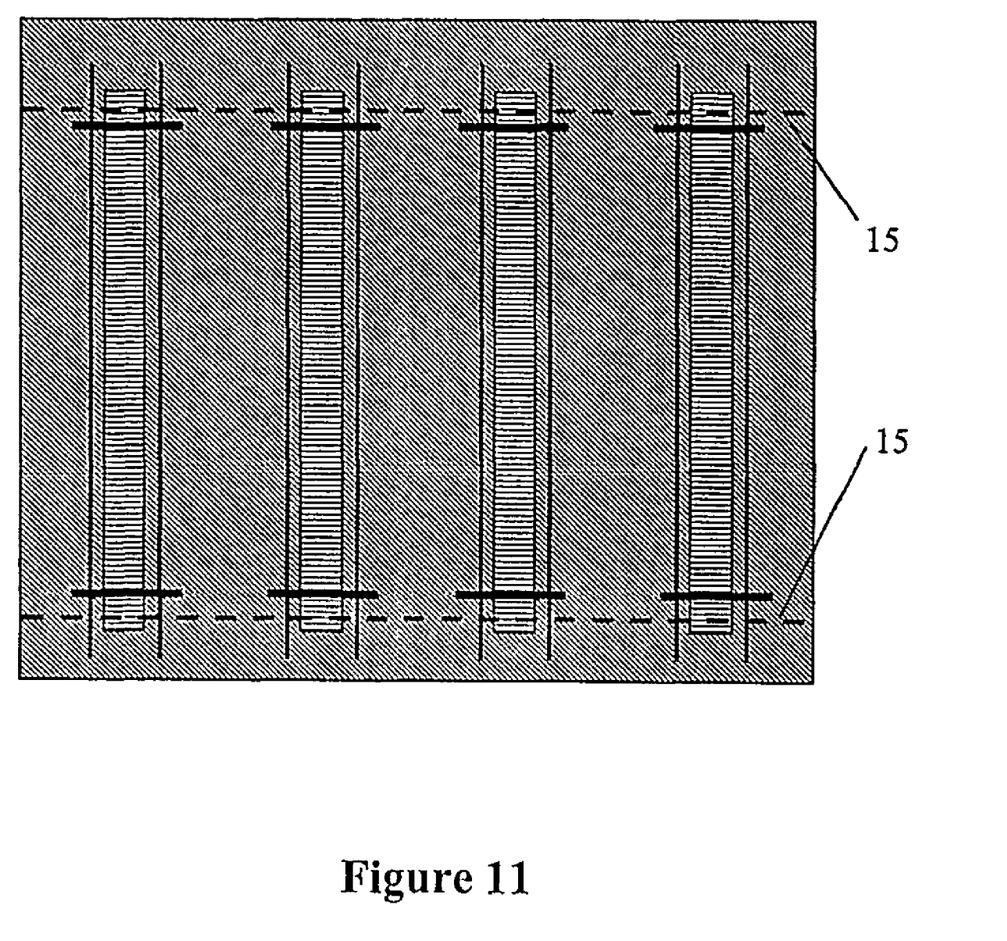
FIG. 11 is a schematic diagram showing a top view of a wafer with solar cells formed on strips after cell interconnection in accordance with a preferred embodiment.
Figure 12:
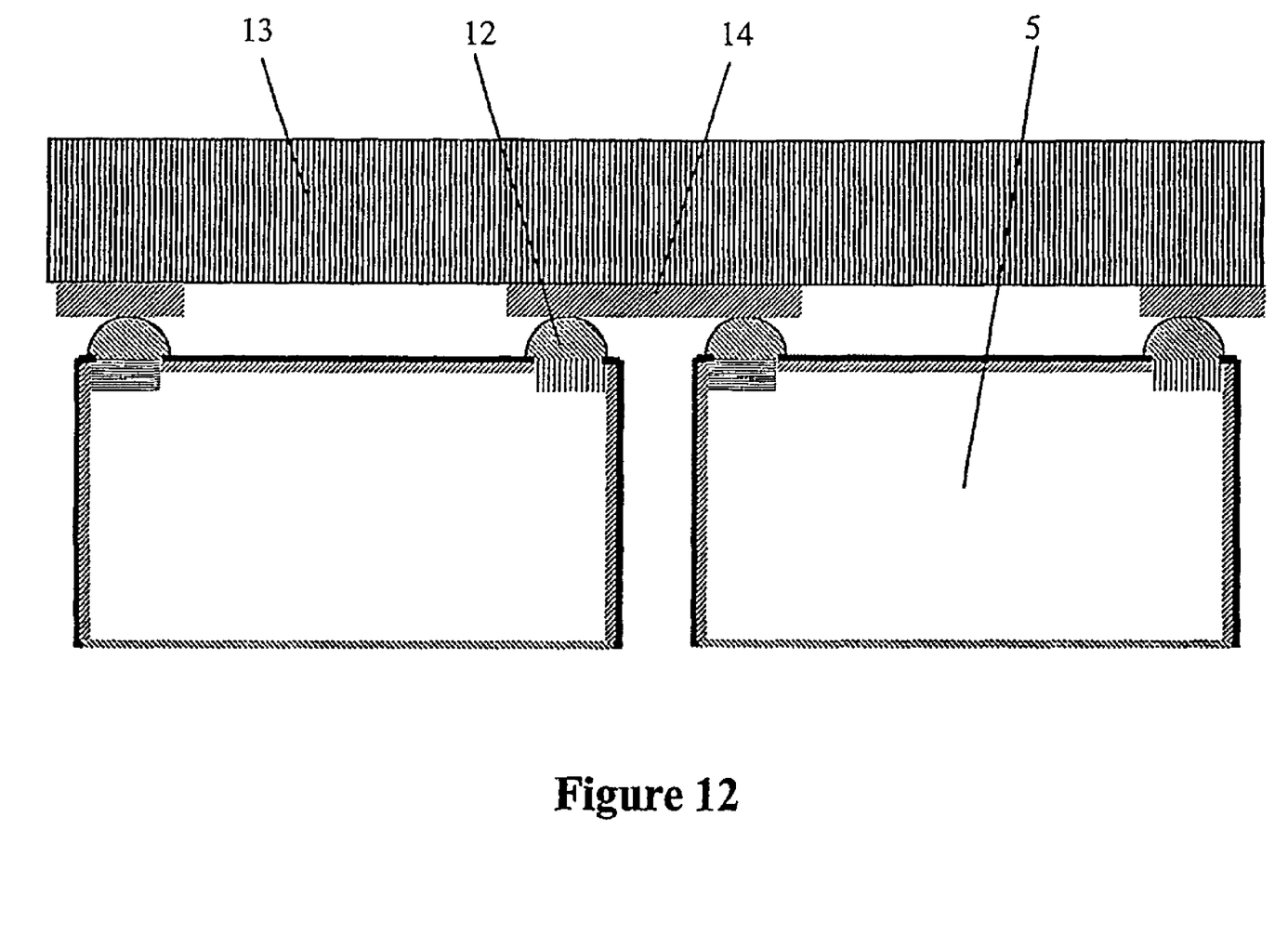
FIG. 12 is a schematic diagram showing a cross sectional view of a wafer with solar cells formed on strips after cell interconnection in accordance with a preferred embodiment.

The solar cells processed from individual strips may be mounted and interconnected on a glass superstrate. For example, FIG. 10 shows a silicon wafer with etched channels 4 and solar cells 5 with metal contacts 12 which remain attached to the silicon substrate at the wafer edges. Channels 4 extend beneath solar cells 5 but these parts of channels 4 are not seen in FIG. 10. A glass superstrate 13 has been provided with solder tracks 14 to allow interconnection of the cells 5. This glass superstrate 13 is placed on top of the silicon wafer, as shown in FIG. 11. The superstrate-substrate assembly is heated to a temperature above the melting point of the solder 14 to join the solder tracks 14 to the metal tracks 12 on the solar cells 5. The glass 13 is of a type whose thermal expansion coefficient closely matches that of silicon over the range of temperatures encountered during the bonding process. As shown in FIG. 12, the individual cells are connected in series so that the resultant composite device is characterised by a high voltage and low current compared to conventional crystal silicon solar cells. In order to separate the cells from the substrate, cuts 15 are made through the strips near the edges of the wafer. A laser or dicing saw can be used for this purpose.

Figure 13:
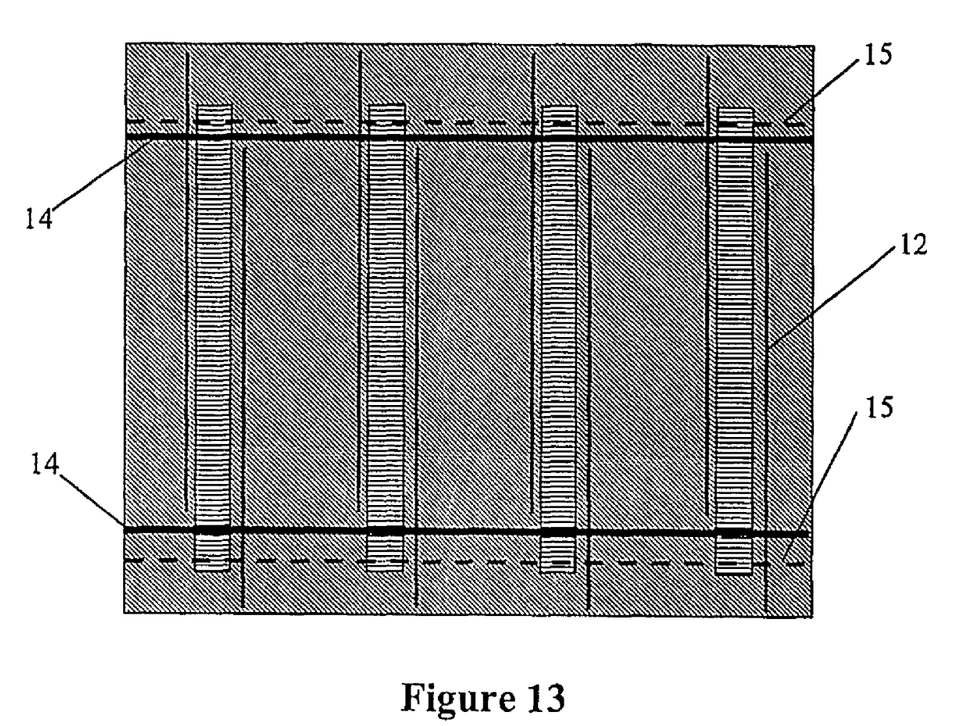
FIG. 13 is a schematic diagram showing a top view of a wafer with solar cells formed on strips after cell interconnection in accordance with a preferred embodiment.

In an alternative embodiment, the metal contacts 12 to either side of each individual cell are offset from each other in a direction parallel to the longest dimension of the cell, and the metal tracks 14 on the glass wafer extend across the glass wafer in a direction perpendicular to the cell contacts so as to effect parallel connection between the individual cells, as shown in FIG. 13.

Figure 14:
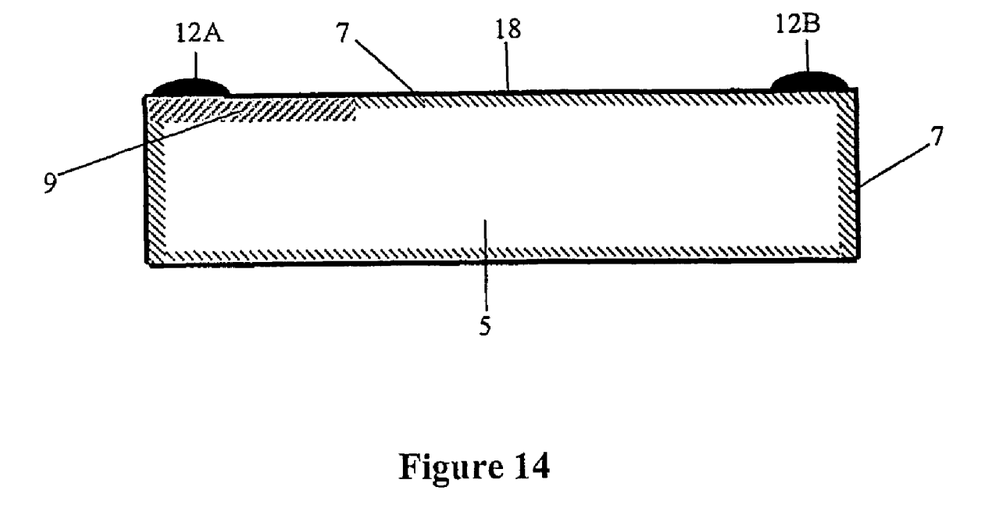
FIG. 14 is a schematic diagram showing a cross section of an alternative solar cell made from a thin silicon strip produced by a process of the invention.

FIG. 14 illustrates in diagrammatic form another solar cell formed from a silicon strip released from a p type silicon substrate. First, silicon strips 5 are formed in the wafer, with the strips being released from the silicon wafer everywhere except at the wafer edges, as described above. The etch mask layer is stripped. In the case where the etch mask layer is silicon nitride, it can be stripped in a aqueous solution of hydrofluoric acid at room temperature, or in orthophosphoric acid at 180° C. The strips may be textured using a suitable method, such as reactive ion etching (RE). A light phosphorus diffusion 7 of about 100 ohm/square is made into all surfaces. A layer of silicon dioxide typically 150 nm thick is thermally grown on all surfaces. The oxide is removed from a portion of the top surface of the silicon strip. This can be done, for example, through the use of etch pastes. Such pastes, which can be applied by standard screen printing techniques and which can be used to etch both silicon nitride and oxide at or slightly above room temperature, are available from Merck Chemicals. A heavy boron diffusion 9, typically 30 ohm per square, is made into the exposed silicon surface. The oxide is stripped. This can be done, for example, in an aqueous solution of hydrofluoric acid at room temperature. An antireflection coating 18 is now applied. This can be, for example, a combination of an approximately 20 nm thick layer of silicon dioxide followed by approximately 50 m of silicon nitride, deposited by low pressure chemical vapour deposition (LPCVD). The combination of thin oxide and LPCVD nitride is able to provide excellent surface passivation and antireflection properties. LPCVD nitride has the property that it will uniformly coat all surfaces, even surfaces hidden within narrow channels.

Contact regions are opened by selectively removing the oxide/nitride stack in the appropriate regions. Etch pastes can again be used for this purpose. Next, the p metal contacts 12A and the n metal contacts 12B are formed. This can be done, for example, by electroless plating. Finally, the cells are released from the substrate by cutting through the strips near the edges of the wafer. This can be done, for example, using a dicing saw or a laser.

Figure 15:
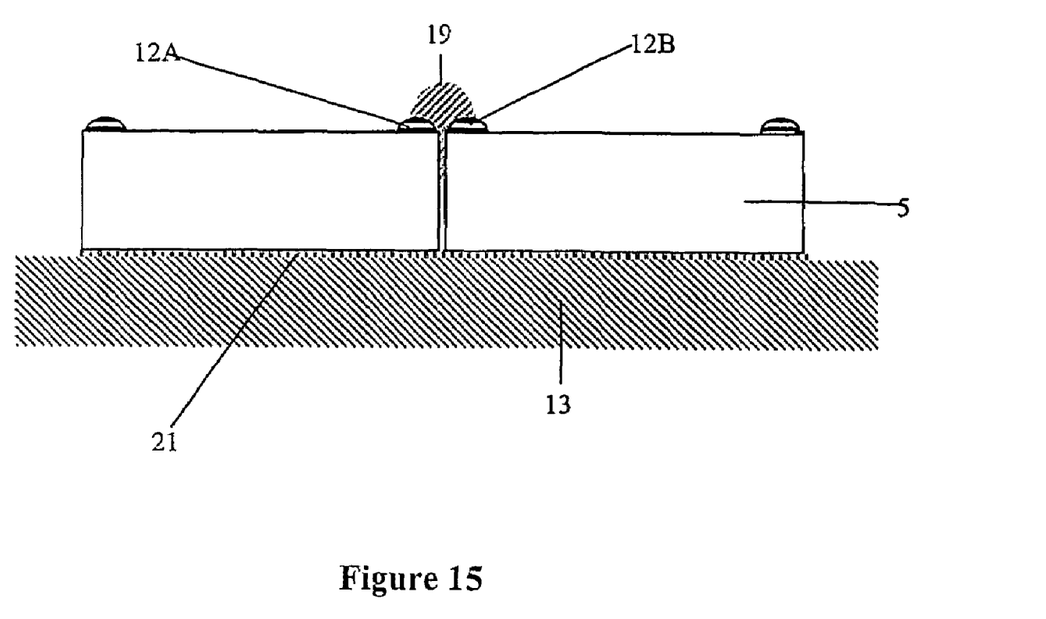
FIG. 15 is a diagrammatic representation of a method of mounting and interconnecting solar cells as illustrated in FIG. 14.

The individual solar cells may be mounted and interconnected as shown in FIG. 15. Optical adhesive 21 is applied to a suitable glass sheet 13. The cells 5 are picked up and transferred to the superstrate, and the optical adhesive is cured. To connect the cells in series, electrical adhesive 19 is applied to join the p contact 12A of one cell to the n contact 12B of the adjacent cell.

The above embodiments provide methods for producing thin rectangular strips of silicon or a silicon sheet, the thickness of the strips or the sheet being much smaller than the wafer thickness. The individual strips or sheet can be processed into solar cells and then detached from the substrate. Following this process, the substrate has been reduced in thickness by an amount much less than the original substrate thickness, and can be re-used for the production of further thin silicon strips or sheet.

Many modifications will be apparent to those skilled in the art without departing from the scope of the present invention as hereinbefore described with reference to the accompanying drawings.

The invention claimed is:

1. A process for producing a layer of single-crystal silicon, said process comprising the steps of forming parallel, first trenches in a silicon substrate of substantially (111) orientation; applying an etch-resistant layer to the surface of said first trenches; forming a series of narrower second trenches inside said first trenches; contacting said second trenches with an etchant to which {111} planes of silicon are substantially resistant, and etching lateral channels from said second trenches until adjacent and opposing etch fronts at least substantially meet, thereby defining said layer of single-crystal silicon; and detaching said layer from said substrate.

2. A process according to claim 1 wherein said first and second trenches extend continuously from one edge of said silicon substrate to an opposite edge of said silicon substrate.

3. A process according to claim 1 wherein said first and second trenches do not extend as far as at least one edge of said silicon substrate.

4. A process according to claim 3 where said first and second trenches do not extend to any edge of said silicon substrate.

5. A process according to claim 1 wherein said adjacent and opposing etch fronts meet.

6. A process according to claim 1 wherein said layer of single-crystal silicon comprises a plurality of strips of silicon.

7. A process according to claim 6 where said strips are attached to said layer at least at one end of said strips, said process further comprising the step of separating said strips from said layer of silicon.

8. A process according to claim 6 or claim 7 further comprising the steps of forming a plurality of solar cells from said plurality of strips before or after said strips are separated.

9. A solar cell prepared by the process of claim 8.

* * * * *